United States Patent [19]

Dammann et al.

[11] 4,159,164

[45] Jun. 26, 1979

[54] METHOD OF ELIMINATING ERRORS IN IMAGES DERIVED FROM PATTERNS WHICH CONSIST OF PERIODICALLY ARRANGED INDIVIDUAL IMAGES

[75] Inventors: Hans Dammann, Tangstedt; Erhard Klotz, Halstenbek, both of Fed. Rep. of Germany

[73] Assignee: U.S. Philips Corporation, New York, N.Y.

[21] Appl. No.: 854,340

[22] Filed: Nov. 23, 1977

Related U.S. Application Data

[63] Continuation of Ser. No. 662,455, Mar. 1, 1976, abandoned, which is a continuation of Ser. No. 515,600, Oct. 17, 1974, abandoned.

[30] Foreign Application Priority Data

Oct. 23, 1973 [DE] Fed. Rep. of Germany ....... 2352957

[51] Int. Cl.² ............................................. G02B 27/38
[52] U.S. Cl. ............................................. 350/162 SF
[58] Field of Search ................... 356/71; 350/162 SF, 350/205

[56] References Cited

U.S. PATENT DOCUMENTS

| | | | |
|---|---|---|---|
| 3,630,596 | 12/1971 | Watkins | 350/162 SF |
| 3,746,455 | 7/1973 | Flamholz | 356/168 |
| 3,790,280 | 2/1974 | Heinz et al. | 356/71 |
| 3,809,478 | 5/1974 | Talbot | 356/71 |
| 3,813,142 | 5/1974 | Buhrer | 350/162 R |
| 3,821,794 | 6/1974 | Yoneyama | 358/47 |
| 3,862,357 | 1/1975 | Kanazawa et al. | 350/162 SF |
| 3,867,639 | 2/1975 | Engel | 250/550 |

FOREIGN PATENT DOCUMENTS 905181 7/1972 Canada ............................. 350/162 SF

OTHER PUBLICATIONS

Dammann et al., *Optics Communications*, vol. 3, No. 4, pp. 251–253, Jun. 1971.
Flamholz et al., *Electro-Optical Systems Design*, vol. 5, No. 5, May 1973, pp. 26–30.

*Primary Examiner*—Ronald J. Stern
*Attorney, Agent, or Firm*—Thomas A. Briody; William J. Streeter; Simon L. Cohen

[57] ABSTRACT

The invention relates to a method of eliminating errors in images of patterns which consist of periodically arranged individual images by optical filtering, only certain selected diffraction orders of the regular pattern to be imaged in the form of a ring or parts of a ring being employed for further imaging.

2 Claims, 4 Drawing Figures

METHOD OF ELIMINATING ERRORS IN IMAGES DERIVED FROM PATTERNS WHICH CONSIST OF PERIODICALLY ARRANGED INDIVIDUAL IMAGES

This is a continuation of Ser. No. 662,455, filed Mar. 1, 1976 now abandoned, which was a continuation of Ser. No. 515,600 filed Oct. 17, 1974 now abandoned.

The invention relates to a method of eliminating errors in images derived from patterns which consist of periodically arranged individual images by optical filtering. In this respect it is an essential feature that the Fraunhofer diffraction image of such a periodic structure of individual images, i.e., of an optical diffraction grating with specially shaped grooves, essentially consists of a periodic structure of dot-shaped light distributions, viz. of the diffraction orders of the grating. An amplitude filter in the plane of the diffraction image only transmits diffraction orders of the desired regular pattern, whereas the diffraction spectrum of the errors is masked out—and thus the errors themselves.

The error-free real images must be transferred to light-sensitive layers, e.g. photo-emulsions, photo-resist layers etc. However, the bases of said layers, e.g. glass plates or semiconductor slices, generally are not plane enough to gaurantee perfect imaging with the available depth of field (several μm) of the real images. This is particularly unfavorable in the case of masks as for example used in manufacturing camera tubes with a target containing silicon as photo-conductive element. The images of said masks should be transferred to silicon slices which generally are substantially and irregularly curved, while avoiding and, if necessary, eliminating errors.

It is an object of the present invention to produce perfect images on layers to be exposed which are not entirely plane.

According to the invention this is achieved in that only specific selected diffraction orders in the form of a ring or of parts of a ring of the regular pattern to be imaged are used for further imaging.

For regular patterns to be imaged, such for example the said mask, this yields the advantage of a very large depth of field, while moreover the total number of holes in the mask may be increased. The depth of field of the image can be increased from some microns to approx. 20 mm. The large depth of field thus obtained furthermore has the advantage that even in the case of slightly plane light-sensitive layers it is no longer necessary to adhere to an accurately defined depth-of-focus during the exposure. This is of special significance in the case of exposures with shortwave light, especially ultra-violet light, for which mere visual focussing is no longer possible. The photo-sensitive material which is most commonly used in the semiconductor technology, viz. photo-resist, has its maximum sensitivity in the utra-violet range.

Moreover, according to the present invention, it becomes possible to increase the total number of holes by certain factors (e.g. 4 or 9) while maintaining the structure and the overall size of the mask. This creates new possibilities in respect of applications, which with conventional means could only be realized with comparatively great effort.

An embodiment of an hexagonal mask will be described with reference to the drawing. In the drawing.

Figure 1:
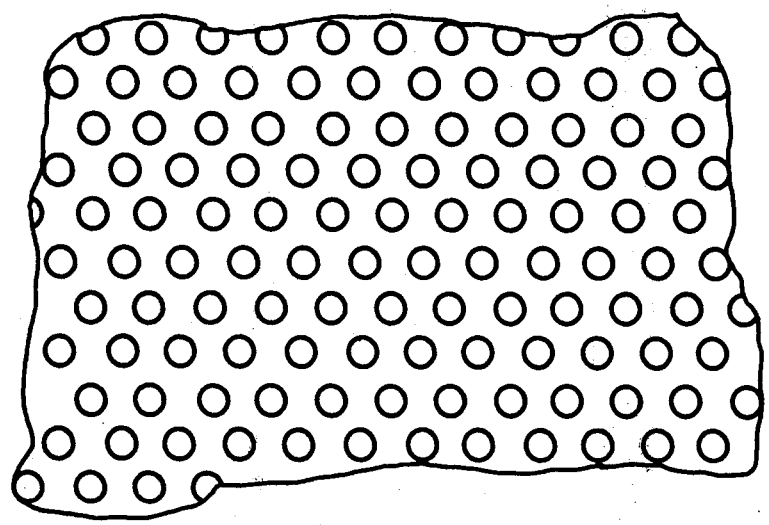
FIG. 1 shows a part of a mask with a hexagonal pattern of holes.
Figure 2:
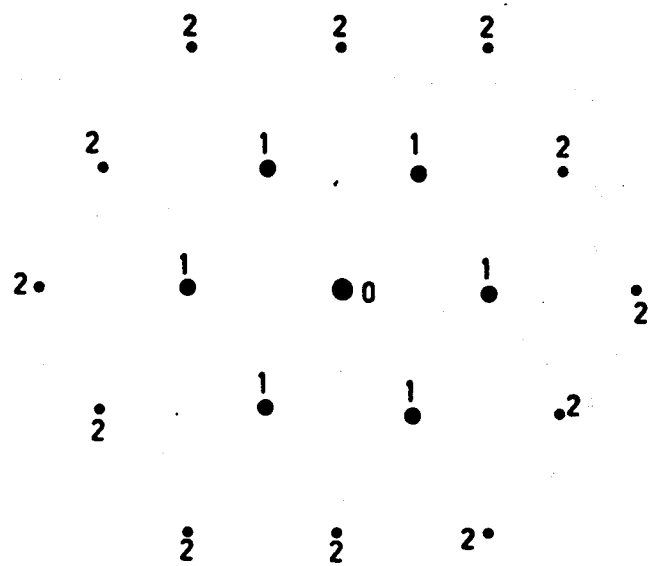
FIG. 2 shows the central part of the associated diffraction spectrum.
Figure 3:
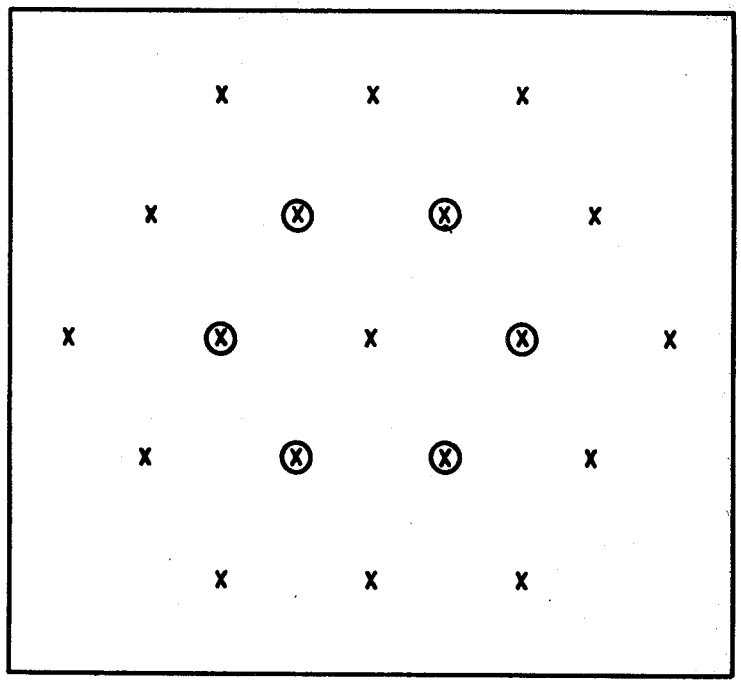
FIG. 3 shows an amplitude filter for increasing the depth of field when optically filtering the pattern obtained by means of said mask.

FIG. 1 shows a part of a mask which is used in manufacturing camera tubes with a target containing silicon as photo-conductive element, the photographic negative of FIG. 1 serving as "mask". The hexagonal diffraction spectrum of FIG. 2 which is associated with a mask according to FIG. 1, consists of images of the zero diffraction order and images of the higher diffraction orders which are arranged around it in rings: an inner ring consisting of six first-order diffraction images 1, a ring which is twice as wide consisting of twelve second-order diffraction images 2 etc. According to the present invention only first order diffraction images or only second-order diffraction images etc. are used in the optical filtration, e.g. in the filter of FIG. 3 only all first-order images are used. The position of the diffraction orders is marked by crosses in FIG. 3.

Said filtering, apart from the elimination of mask errors, if any, provides a substantial improvement of the depth of field.

Figure 4:
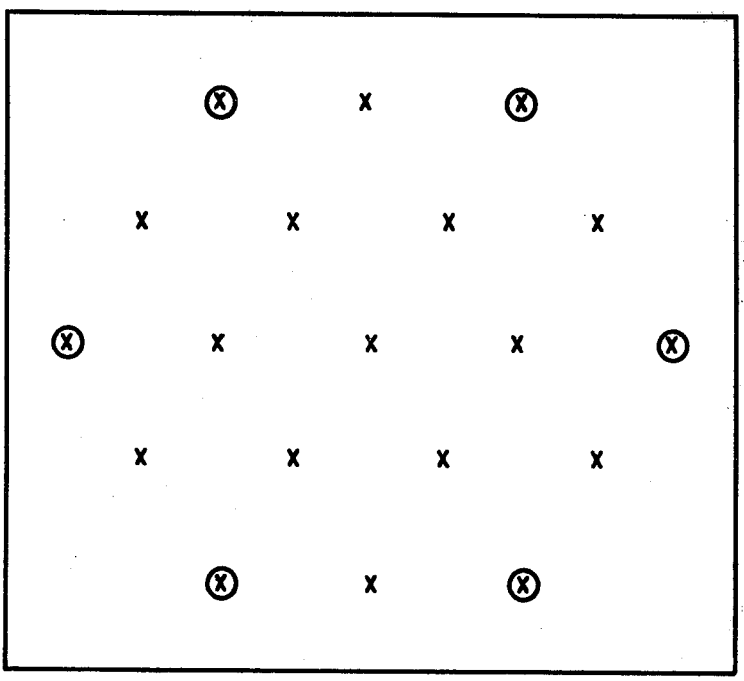
FIG. 4 shows an amplitude filter for increasing both the depth of field and the total number of holes in the optically filtered pattern.

A filter according to FIG. 4, in addition to the depth of field, enables the total number of holes of the mask to be increased by a factor 4. As in the ring of the twelve second-order diffraction images 2 only six images are transmitted, the transmitted diffraction images constitute the same geometrical structure as in FIG. 3, but enlarged by a factor 2. As a result, in comparison with the original pattern twice as many holes of half the diameter are obtained in the image in both dimensions, so that the total number of holes increases by a factor 4 for the same image field. In the ring of the 18 third-order diffraction images (not shown in FIG. 2) it is accordingly possible to select six images, so that the total number of holes increases by a factor 9, etc.

The description relates to the specific case of a hexagonal pattern; for other structures with a regular pattern the diffraction orders naturally have correspondingly different structures. In general, a ring of diffraction-order images according to the present invention is defined in that all diffraction images of said ring are disposed at the same distance from the zeroth diffraction order image. This definition renders the above description for the hexagonal pattern also applicable. Similarly, holes of a shape other than round are permissible.

Furthermore, a suitable embodiment of the present invention consists in that as mask for filtering a corresponding phase structure is employed instead of the original black-white mask. By a suitable adjustment of the height and the relief of the phase structure of brightness of the orders transmitted during filtering—as is known in principle—can be increased substantially. Such phase structures may for example be produced by fading out photographic exposures or by copying the black-white mask on photo-resist.

What is claimed is:

1. A method of correcting errors in imperfect periodic two-dimensional patterns comprising:
  optically forming a composite Fraunhofer diffraction image of the periodic two-dimensional pattern, whereby a plurality of groups of individual diffraction images are formed, each group forming a ring about a single central individual diffraction image, each ring corresponding to a single diffraction order of the pattern, and passing only a ring-shaped plurality of the individual diffraction images from one of the rings representing a single diffraction order through an optical filter, forming an inverse Fraunhofer diffraction image of the filtered individual diffraction images, and recording said inverse diffraction image on an imperfectly planar surface.

2. A method as recited in claim 1, wherein said imperfect periodic two-dimensional pattern is a phase structure.